United States Patent [19]

Sasaki

[11] Patent Number: 4,996,163

[45] Date of Patent: Feb. 26, 1991

[54] METHOD FOR PRODUCING AN OPTO-ELECTRONIC INTEGRATED CIRCUIT

[75] Inventor: Goro Sasaki, Yokohama, Japan

[73] Assignee: Sumitomo Electric Industries, Ltd., Osaka, Japan

[21] Appl. No.: 313,507

[22] Filed: Feb. 22, 1989

[30] Foreign Application Priority Data

Feb. 29, 1988 [JP] Japan .................................. 63-46901
Feb. 29, 1988 [JP] Japan .................................. 63-46902

[51] Int. Cl.⁵ .......................................... H01L 31/18
[52] U.S. Cl. ............................ 437/5; 148/DIG. 119; 148/DIG. 120; 357/30; 357/56; 372/50; 437/59; 437/133; 437/904; 437/912
[58] Field of Search .................. 148/DIG. 56, 65, 72, 148/97, 110, 119, 120, 169; 357/30, 15, 16, 41, 55, 56; 372/43, 44, 50, 46; 437/2, 3, 5, 51, 54, 59, 65, 66, 81, 107, 126, 133, 904, 912, 936, 976, 987

[56] References Cited

U.S. PATENT DOCUMENTS

| | | | |
|---|---|---|---|
| 4,352,116 | 9/1982 | Yario et al. | 357/17 |
| 4,366,567 | 12/1982 | Fukuzawa et al. | 372/50 |
| 4,551,394 | 11/1985 | Betsch et al. | 437/129 |
| 4,608,696 | 8/1986 | Law et al. | 357/17 |
| 4,719,498 | 1/1988 | Wada et al. | 372/50 |
| 4,777,516 | 10/1988 | Deschler et al. | 357/17 |
| 4,829,346 | 5/1989 | Kasahara et al. | 357/22 |

FOREIGN PATENT DOCUMENTS

| | | | |
|---|---|---|---|
| 0149076 | 4/1974 | Japan | 437/129 |
| 0044769 | 3/1983 | Japan | 437/129 |
| 0051585 | 3/1984 | Japan | 372/50 |
| 0193393 | 10/1985 | Japan | 372/50 |
| 0270883 | 12/1986 | Japan | 372/50 |
| 0056955 | 3/1988 | Japan | 372/50 |

OTHER PUBLICATIONS

Albrecht et al., "Monolithically ... Indium Phosphide Photodiode Junction Field-Effect Transistor ...", IEE Conf. Publ., 292, 14th, Part 2, 1988, pp. 9-12.
Kasahara et al., "Monolithically Integrated ... Indium Phosphide-MISFET Photoreceiver", Electron. Lett., 20(8), 1984, pp. 314-315.
Sasaki et al., "Monolithic Pin-HEMT Amplifier ...", Electron. Lett., (24) 19, 15 Sep. 1988, pp. 1201-1202.

Primary Examiner—Brian E. Hearn
Assistant Examiner—William Bunch

[57] ABSTRACT

Present invention is to provide a process for producing an opto-electronic integrated circuit comprising a field effect transistor as an electronic device and a photodiode as an optical device both formed on an InP substrate, the field effect transistor comprising a high electron mobility transistor having:

a GaInAs layer epitaxially grown in the InP substrate in a preset region thereof, a n-AlInAs layer epitaxially grown on the GaInAs layer, a gate electrode formed on the AlInAs layer, and a source electrode and a drain electrode formed on the AlInAs layer with the gate electrode therebetween, and the photo-diode comprising a PIN photo-diode having:

the GaInAs layer epitaxially grown on the InP substrate near the region of the field effect transistor simultaneously with the growth of that of the field effect transistor, the n-AlInAs layer epitaxially grown on the GaInAs layer simultaneously with the growth of that of the field effect transistor, a n-InP layer epitaxially grown on the n-AlInAs layer, an undoped GaInAs layer epitaxially grown on the n-InP layer in a preset region thereof, a p-GaInAs layer epitaxially grown on the undoped GaInAs layer, an anode electrode formed on the p-GaInAs layer, and a cathode electrode formed on the n-InP layer near the undoped GaInAs layer.

4 Claims, 8 Drawing Sheets

METHOD FOR PRODUCING AN OPTO-ELECTRONIC INTEGRATED CIRCUIT

BACKGROUND OF THE INVENTION

1. Field of the Invention

Present invention relates to an opto-electronic integrated circuit (OEIC) having a semiconductor optical device and electronic device integrated monolithically on one substrate.

2. Related Background Art

Following methods are known as a method for producing the opto-electronic integrated circuit.

First method as described in Presentation No. S9-1, 1987 National Conference of Semiconductor Materials Section, Association of Electronic Information Communication, is composed of steps of; forming a photodiode (PD) as an optical device on an indium phosphide (InP) substrate by the vapor phase epitaxy (VPE), forming a gallium arsenide (GaAs) layer next to the PD on the InP substrate, and forming a field effect transistor (FET) thereon as an electronic device.

Second method, as described in Presentation No. S9-3, 1987 National Conference of Semiconductor Materials Section, Association of Electronic Information Communication, is composed steps of; forming a recess on an InP substrate, forming PD by the VPE in the recess, removing the layer for the PD in a FET region, forming an epitaxial layer for the FET, and forming the FET on the epitaxial layer;

And third method, as described in Presentation No. S9-2, 1987 National Conference of Semicondcutor Materials Section, Association of Electronic Information Communication is composed of steps of; forming a n-GaInAs layer for a junction type field effect transistor (J-FET) and an epitaxial layer for a PD respectively on an InP substrate, and performing beryllium (Be) ion implantation to form a p-region so as to form the PD and the J-FET.

But, in the first and the second methods, it is necessary to grow an epitaxial layer for a PD and remove the unnecessary potion thereof to grow anew an epitaxial layer for a FET. The production steps are accordingly complicated. This results in the problems that it is difficult to make highly pure crystals in growing anew the epitaxial layer, with a result that a FET having good characteristics cannot be reproduced with ease.

The third method requires a Be ion implantation step and an annealing step. This results in the problem that the method is accordingly complicated. Another problem is that wafers is bent in the annealing step, and the lithography in a following step result in low precision. Further another problem is that the method for the third circuit has to use as a FET a J-FET, whose high frequency characteristics are not good.

SUMMARY OF THE INVENTION

A first object of present invention is to provide a method for producing an opto-electronic integrated circuit which enables a plurality of epitaxial layers respectively necessary for an optical device and an electronic device to be formed simultaneously and which includes accordingly simplified processing steps.

A second object of present invention is to provide a method for producing an opto-electronic integrated circuit which excludes a step of ion implantation and accordingly does not require an annealing step which has been a cause for low precision of the lithography.

A third object of present invention is to provide a method for producing an opto-electric integrated circuit having a field effect transistor as an electronic device and a photo-diode as an optical device both formed on an InP substrate, comprising:

a first step of forming a first epitaxial layer of gallium indium arsenide (GaInAs), a second epitaxial layer of n-type aluminum indium arsenide (n-AlInAs), a 0hird epitaxial layer of n-type indium phosphide (n-InP), a fourth epitaxial layer of undoped GaInAs and a fifth epitaxial layer of p-type gallium indium arsenide (p-GaInAs) formed on an InP substrate in the stated order;

a second step of removing the fifth and the fourth epitaxial layers, leaving a p-type electrode (p-electrode) region in a photo-diode region so as to expose the third epitaxial layer;

a third step of forming an anode of said photo-diode on the fifth epitaxial layer and a cathode thereof on the third epitaxial layer in the photo-diode region, and forming a source electrode and a drain electrode of the field effect transistor on the third epitaxial layer in a field effect transistor region;

a fourth step of removing the third, the fourth and the fifth epitaxial layers between the photo-diode and the field effect transistor so as to electrically separate both regions;

a fifth step of etching the third epitaxial layer between the source electrode and the drain electrode in the field effect transistor region to expose the second epitaxial layer so as to form a gate electrode on the exposed second epitaxial layer; and a sixth step of forming a wiring for electrically connecting the thus formed photo-diode and field effect transitstor.

A fourth object of present invention is to provide an opto-electronic integrated circuit comprising a field effect transistor which is a high electron mobility transistor (HEMT) having high frequency characteristics, or which is a recessed structure type HEMT having excellent high frequency characteristics.

A fifth object of present invention is to provide an opto-electronic integrated circuit comprising a field effect transistor as an electronic device and a photo-diode as an optical device both formed on an InP substrate, the field effect transistor comprising a high electron mobility transistor, the photo-diode comprising a PIN photo-diode, the HEMT comprising a GaInAs layer epitaxially grown on the InP substrate in a preset region thereof, a n-AlInAs layer epitaxially grown on the GaInAs layer, a gate electrode formed on the AlInAs layer, and a source electrode and a drain electrode formed on the AlInAs layer with the gate electrode therebetween, the PIN photo-diode comprising;

the GaInAs layer epitaxially grown on the InP substrate near the region of the field effect transistor simultaneously with the growth of that of the field effect transistor, the n-AlInAs layer epitaxially grown on the GaInAs layer simultaneously with the growth of that of the field effect transistor, a n-InP layer epitaxially grown on the n-AlInAs layer, an undoped GaInAs layer epitaxially grown on the n-InP layer in a preset region thereof, a p-GaInAs layer epitaxially grown on the undoped GaInAs layer, an anode formed on the p-GaInAs layer, and a cathode formed on the n-InP layer near the undoped GaInAs layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. Jdr

DESCRIPTION OF THE PREFERRED EMBODIMENT

Figure 1A:
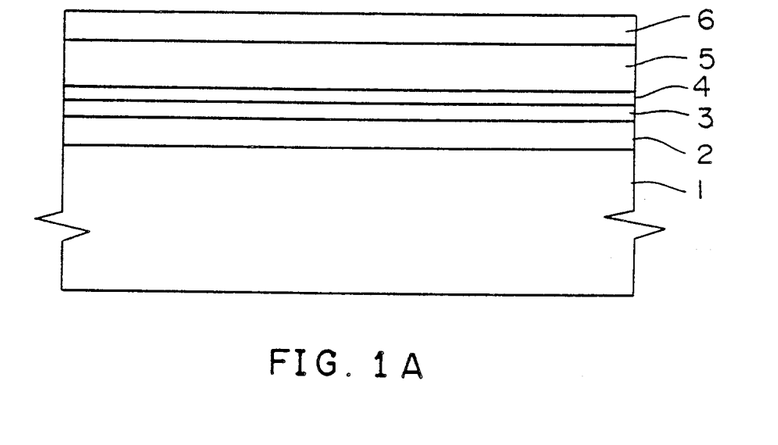
FIGS. 1A, 1B, 1C, 1D, 1E, 1F, 1G, 1H, 1I, 1J, 1K, 1L, and 1M are sectional views of respective steps of the process for producing an opto-electronic integrated circuit according to one embodiment of the invention.

As shown in FIG. 1A, epitaxial layers 2-6 are formed on an iron (Fe) doped InP substrate 1 one upon another by the OMVPE (Organic Metallic Vapor Epitaxy). In this embodiment the substrate temperature is 600° C., the pressure, 60 Torr, and the feed ratio between an element in Group V and an element in Group III (V/III ratio), 180.

The layer 2 of GaInAs is formed by a reaction among three kinds of gas of triethylgallium (TEG), trimethylindium (TMI) and arsine ($AsH_3$). The gas flow rates of TEG and TMI are adjusted so that the composition ratio between the gallium (Ga) and indium (In) of the GaInAs layer 2 is set so as to obtain a lattice conformity with the InP, i.e., Ga:In is substantially 0.47:0.53, and the reaction time is adjusted so that the GaInAs layer 2 has a thickness of about 0.1 $\mu$m (micron).

The layer 3 of n-AlInAs is formed by the reaction among three kinds of gas of TMI, trimethylaluminium (TMA) and arsine. The gas flow rates of TMA and TMI are adjusted so that the composition ratio between the aluminium (Al) and In of the AlInAs layer 3 is set so as to obtain a lattice conformity with the InP, i.e., Al:In is substantially 0.48:0.52, and the reaction time is adjusted so that the AlInAs layer 2 has a thickness of about 300 Å. In forming the layer 3, the partial pressure of the arsine is more increased in the undoped case. When the partial pressure of the arsine is increased, the Al relatively lacks, and the carbon atoms (C) generated in the reaction substitute aluminium atoms. The carbon atoms function as donors, and resultantly the layer becomes n-type.

The layer 4 of n-InP is formed by the reaction between TMI and phosphine ($PH_3$). The reaction time is adjusted so that the layer has a thickness of 2000 521 .

The layer 5 of undoped GaInAs is formed in the same way as the GaInAs layer 2. The reaction time, however, is adjusted so that the layer 5 has a thickness of about 1 to 2 $\mu$m.

The layer of 6 of p-GaInAs is formed basically in the same way as the GaInAs layer 2. The partial pressure of the arsine, however, is lowered than when the GaInAs layer 2 is formed. When the partial pressure of the arsine is lowered, Ga and In atoms in Group III relatively lack. The C atoms generated in the reaction substitute Ga and In atoms, and the C atoms act as acceptors. Resultantly the layer becomes p-type.

Figure 1B:
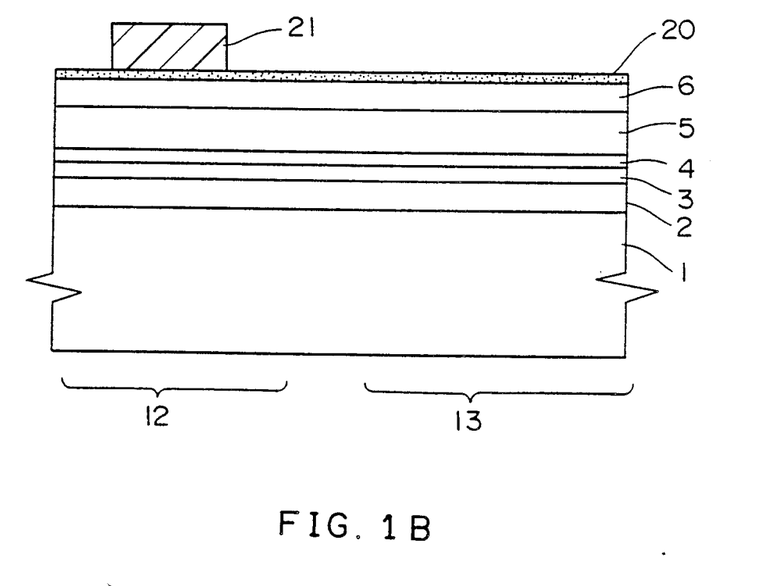

Next, a silicone nitride (SiN) film 20 having a thickness of about 1000 Å is formed on the p-GaInAs layer 6 by the electron cyclotron resonance plasma chemical vapor deposition (ECR Plasma CVD). Further a resist film is applied onto the SiN film 20, and then a resist pattern is left only in a photo-diode (PD) region 12 in which a PIN photo-diode (PIN PD) will be formed (FIG. 1B).

Subsequently, the SiN film 20 is removed by hydrofluroic acid (FH) using the resist pattern 21 as a mask, to form a mask pattern 22 of the SiN film.

Figure 1C:
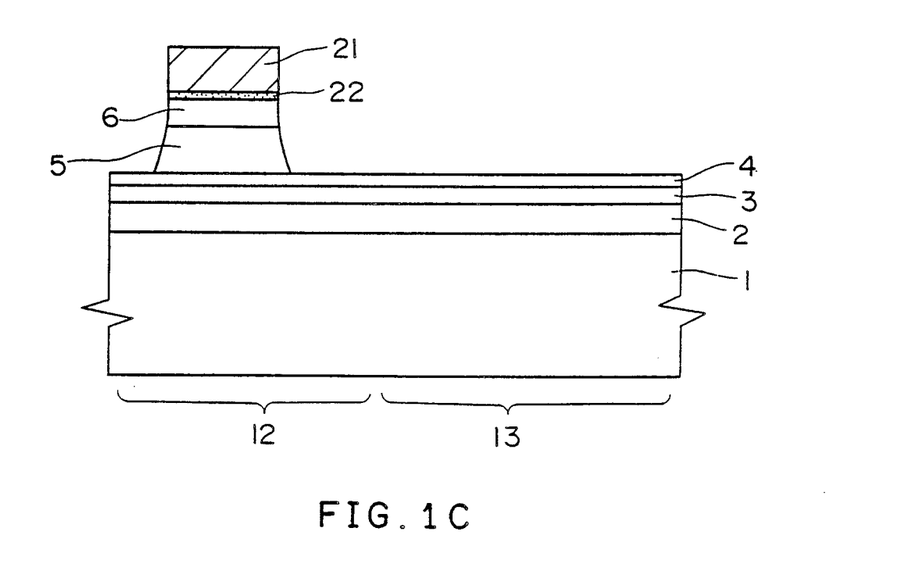

Next, the p-GaInAs layer 6 and the undoped GaInAs layer 5 are sequentially etched by a liquid mixture of phosphoric acid, hydrogen peroxide and water using the mask pattern 22 of the SiN film and the resist pattern 21. The etching liquid containing phosphoric acid as the main component selectively etches GaInAs and InP, i.e., etches the former but does not etch the latter. The etching automatically stops when the n-InP layer 4 is exposed (FIG. 1C).

Figure 1D:
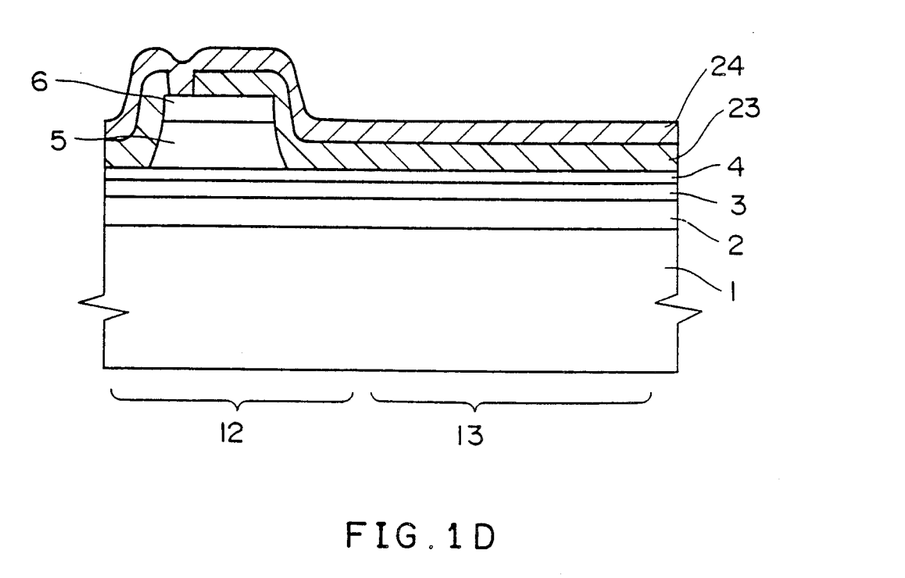

Next, a resist 23 is formed on the p-GaInAs layer 6 left as the p-electrode layer of a PD. The resist 23 has a negative pattern of the p-electrode which will be formed on the p-GaInAs layer 6. Then, on the surface is vaporized a p-ohmic metal film 24 of gold zinc (AuZn) or others (FIG. 1D).

Figure 1E:
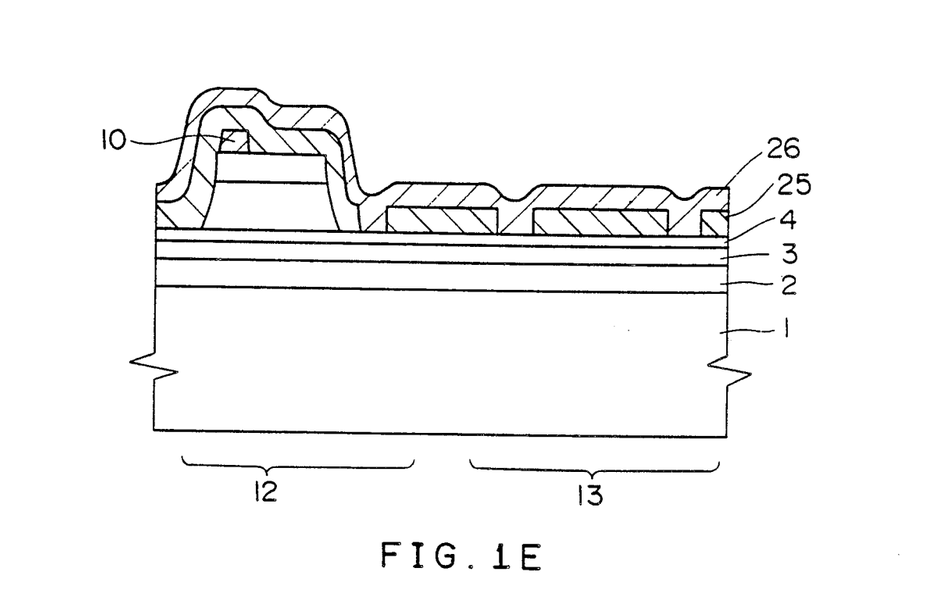

The p-ohmic film 24 is lifted off using the resist 23 to form a p-ohmic electrode 10. Then a resist 25 is formed on the surface, The resist 25 has negative patterns of a n-electrode of the PD and of ohmic electrodes of a HEMT which will be formed in a FET region 13. Further, on the surface is formed a n-ohmic metal film 26 of gold germanium (AuGe) or others (FIG. 1E).

Figure 1F:
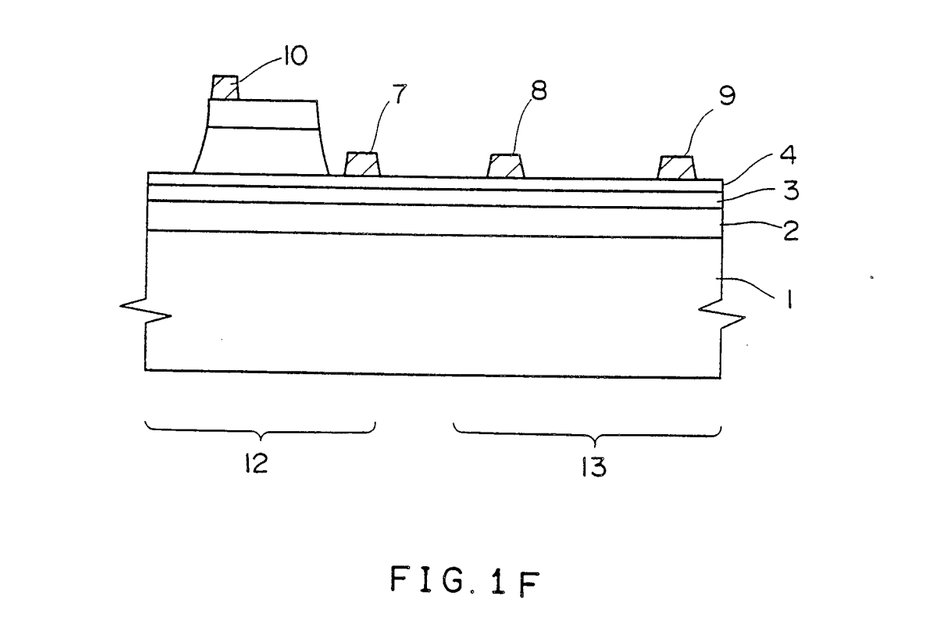

Then the n-ohmic metal film 26 is lifted off using the resist 25 to form n-ohmic electrodes 7, 8, 9. After the electrodes 7, 8, 9 are formed, they are subjected to 1 minute alloying treatment at 350° C. The p-ohmic electrode 10 provides the anode of the PD to be formed in a PD region 12, and the n-ohmic electrode 7 provides the cathode. The n-ohmic electrodes 8, 9 provide a source electrode and a drain electrode of the HEMT to be formed in the FET region 13 (FIG. 1F).

Figure 1G:
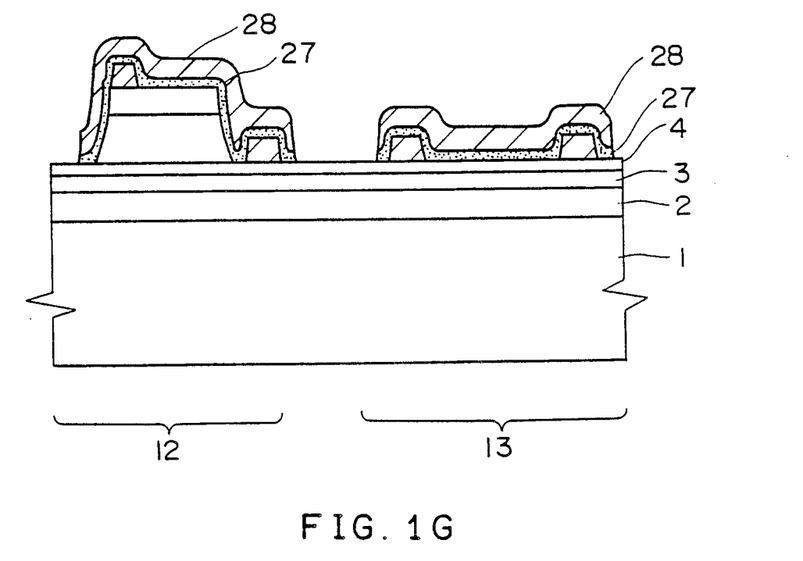

Next, etching is conducted to electrically separate the PD region 12 and the FET region 13. First, a silicone nitride (SiN) film 27 of a thickness of about 1000 Å is formed on the entire surface by ECR plasma CVD. Then, on the film 27 is formed a resist film 28 having a negative pattern of a separation region. The SiN film 27 is removed by hydrofluroic acid (FH) using the resist film 28 as a mask (FIG. 1G).

Figure 1H:
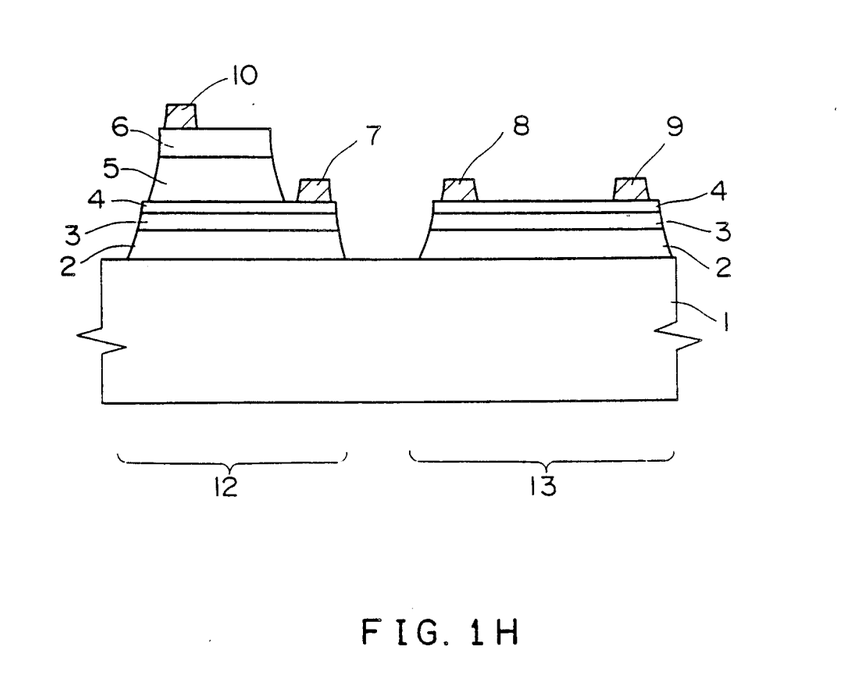

Subsequently, the n-InP layer 4 is etched by an aqueous solution of hydrochloric acid as an etching liquid, using the resist film 28 and the SiN film 27 as masks. The aqueous solution of hydrochloric acid etches InP but does not etch AlInAs. Then, the n-AlInAs layer 3 and the GaInAs layer 2 are etched by a mixture liquid of phosphoric acid and hydrogen peroxide and water. Since this etching liquid does not etch InP, the etching automatically stops when the InP substrate 1 is exposed (FIG. 1H).

Figure 1I:
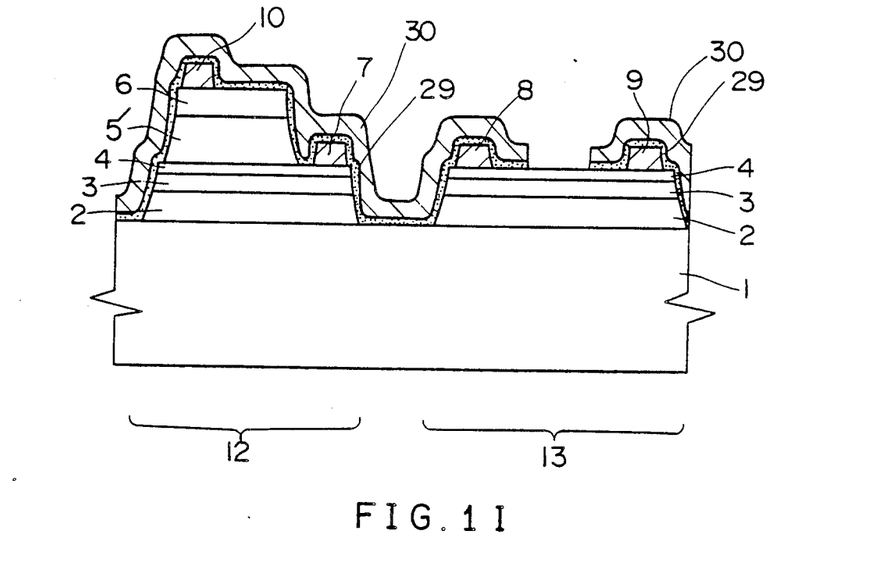
Figure 1J:
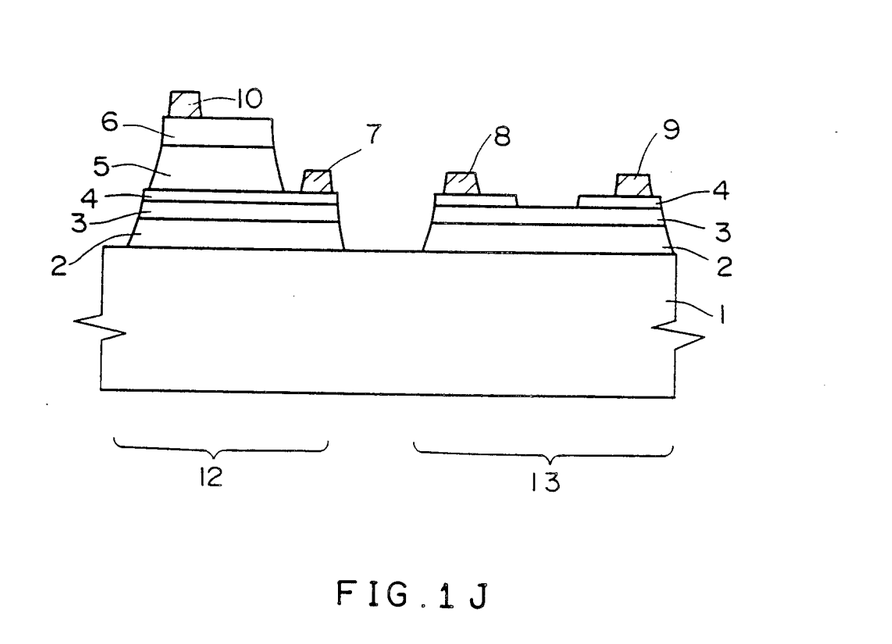

Subsequently, the n-AlInAs layer 3 is exposed in a region of a gate electrode of the HEMT to be formed in the FET region 13. To this end, on the entire surface is formed a SiN film 29 of a thickness of about 1000 Å by the ECR plasma CVD. Then, on the SiN film 29 is formed a resist film 30 having a negative pattern of the gate electrode region. Then, the SiN film 29 is removed by FH using the resist film 30 as a mask (FIG. 1I). Next, the n-InP film 4 is etched by an aqueous solution of hydrochloric acid as an etching liquid using the resist film 30 and the SiN film 29 as masks. As described above, since this etching liquid does not etch AlInAs, the etching automatically stops when the n-AlInAs layer 3 is exposed. Then, the resist film 30 and the SiN film 29 are removed (FIG. 1J).

Figure 1K:
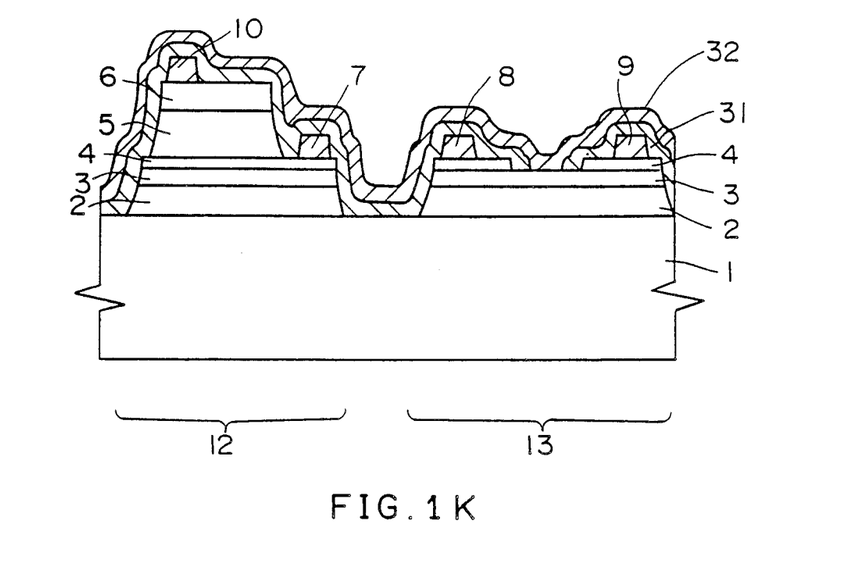
Figure 1L:
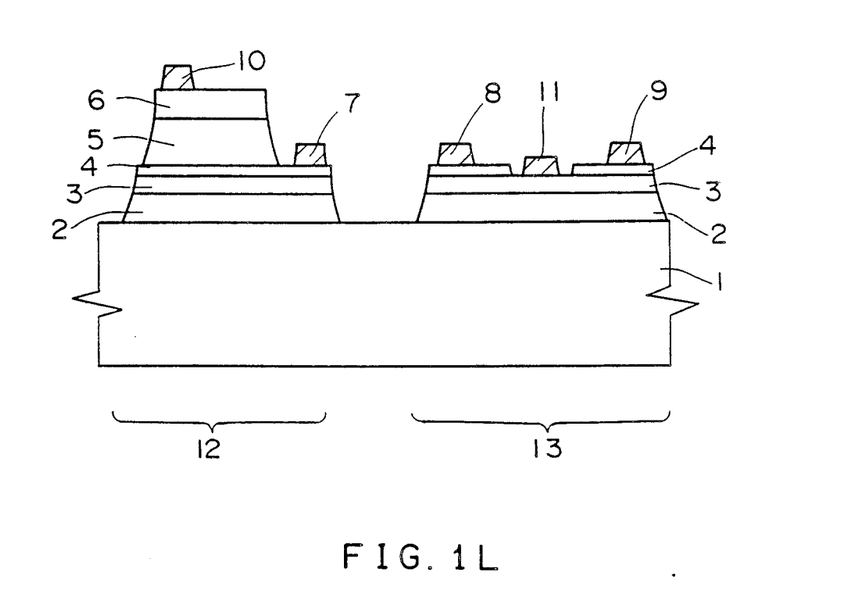

Subsequently, on the surface is formed a resist film 31 having a negative pattern of the gate electrode to be formed in the FET region 13 on the exposed n-AlInAs layer 3. Then, on the surface is vaporized a gate metal film 32 of, e.g., titanium/platinum/gold (Ti/Pt/Au) (FIG. 1K). Next, the gate metal film 32 is lifted off using the resist film 31 to form the gate electrode 11 (FIG. 1L).

Following the above described steps, the PIN photodiode and the HEMT of the recessed structure are formed respectively in the PD region 12 and the FET region 13.

Figure 1M:
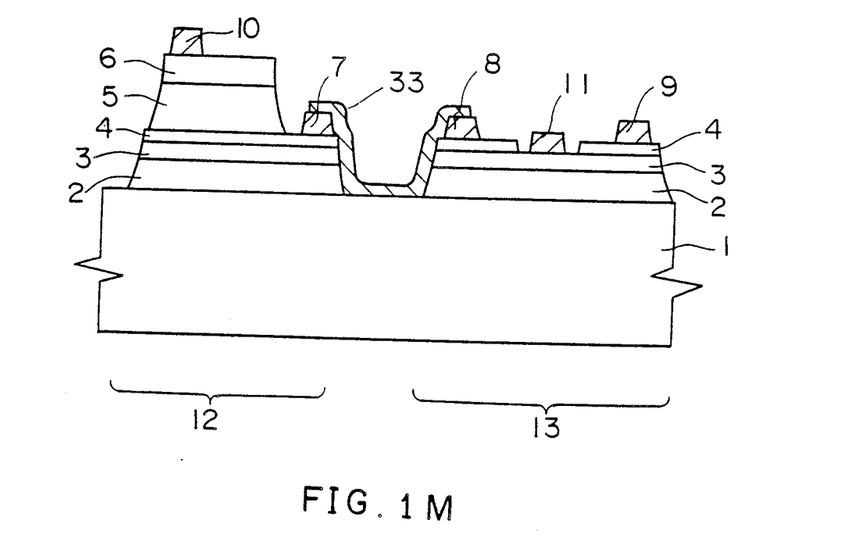

Finally, a resist film having a negative pattern of a wiring is formed, a wiring metal film is vaporized thereon. Then, the wiring metal film is lifted, and a wiring 33 is formed (FIG. 1M).

As described above, since the p-electrode layer 6 is p-doped in the epitaxial growth, the diffusion or the ion implantation steps for forming the p-electrode are not necessary. The n-InP layer 4 is used commonly when the HEMT and the PD are formed.

The HEMT of the recessed structure has an advantage that the source resistance can be easily decreased, and excellent high frequency characteristics, such as a shut off frequency $f_T$ of above 20 giga hertz (GHz).

According to this embodiment, a light receiving opto-electronic integrated circuit which is well responsive to an optical signal of 1 giga bit per second (Gbps) at a light receiving diameter of the PD of 50 μm, and a gate length of 1 μm can be well reproduced.

In the embodiment, the p-GaInAs layer 6 is used as the p-electrode layer of the PD, but in place thereof, a p-InP layer may be used. In this case, in the step of FIG. 1A, p-InP layer is epitaxially grown in place of the p-GaInAs layer 6. But in the step of FIG. 1C, the etching liquid for the epitaxial layer 6 has to be changed to an aqueous solution of hydrochloric acid, or others.

In the embodiment, the n-InP layer 4 is formed in the recessed structure on the n-AlInAs layer 3 so that the contact resistances of the source and the drain electrodes of the HEMT are decreased. But the n-InP layer may be replace with a n-GaInAs layer. In this case, in the steps of forming the epitaxial layers of FIG. 1A, a n-GaInAs layer has to be formed instead of the n-InP layer 4. Further in the step of FIG. 1C, it is necessary that the period of time of etching the undoped GaInAs layer 5 is so controlled that the n-GaInAs layer is not removed. Besides, since the mixture liquid of phosphoric acid, hydrogen peroxide and water exemplifying above the etching liquid of GaInAs adversely etches AlInAs, it is necessary that in the step of FIG. 1J the period of time of etching the n-GaInAs layer 4 is also so controlled that the n-AlInAs layer 3 is not removed. With the n-GaInAs layer used as the epitaxial layer 4, the contact resistances of the source and the drain electrodes are further decreased than with the n-InP layer used as the epitaxial layer 4.

Figure 2:
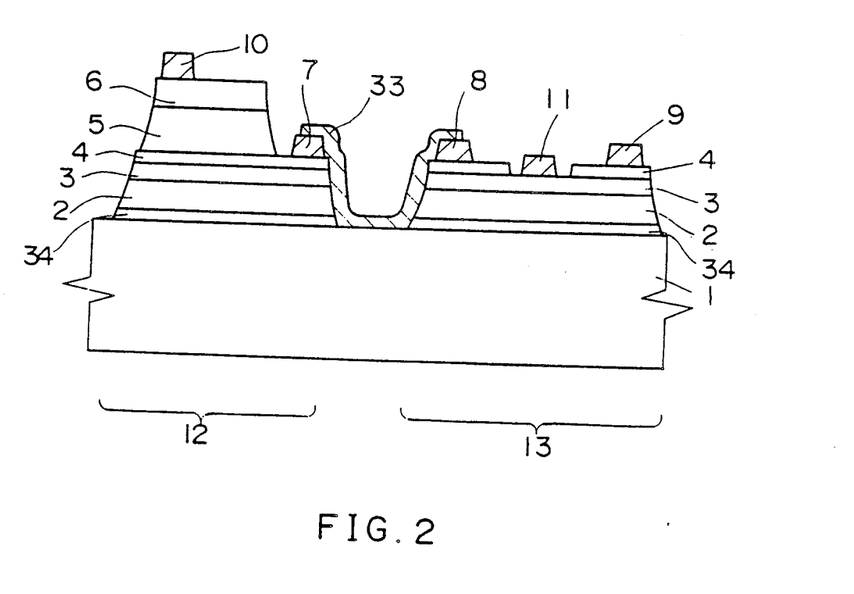
FIG. 2 is a sectional view of the opto-electronic integrated circuit according to one embodiment of the invention, having a buffer layer 34.

FIG. 2 shows another embodiment. In this variation, there is provided a buffer layer 34 of InP or AlInAs having a thickness of about 2000 Å between the InP substrate 1 and the GaInAs layer 2. This buffer layer 34 can be formed together with the oter epitaxial layers in the step of forming the epitaxial layers of FIG. 1A. The buffer layer 34 prohibits the intrusion of the impurities in the InP substrate into the GaInAs layer.

Figure 3:
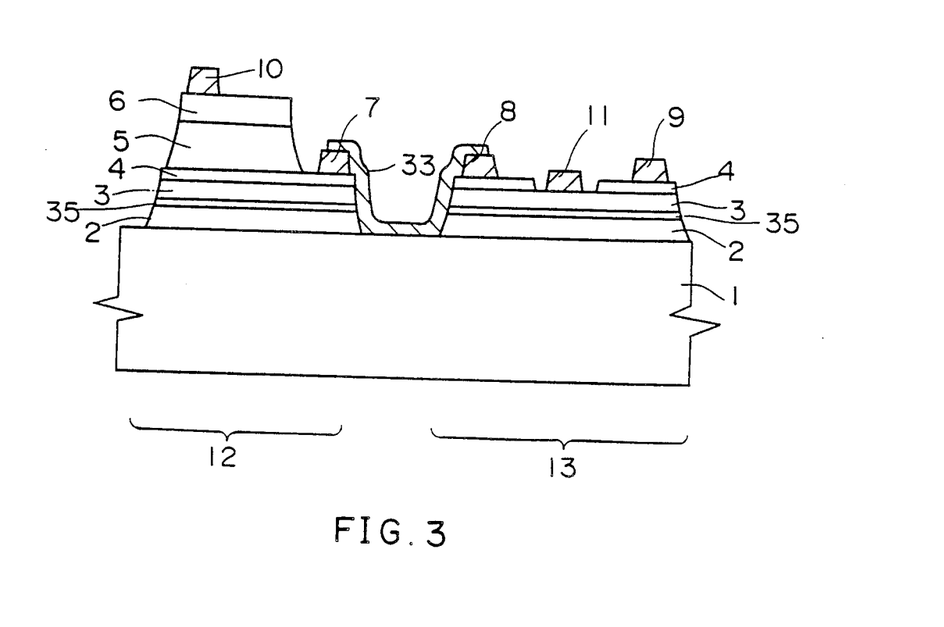
FIG. 3 is a sectional view of the opto-electronic integrated circuit according to further another embodiment of this invention, having a spacer 35.

FIG. 3 shows further another embodiment. In this embodiment, there is interposed an undoped AlInAs layer 35 as a spacer between the GaInAs layer 2 and the n-AlInAs layer 3. This spacer 35 can be formed together with the epitaxial layers in the step of FIG. 1A. The spacer 35 keeps the n-AlInAs layer 3 away from the two-dimensional electron gas of the HEMT so as to place the layer 3 out of the influence of the ionizing impurities of the n-AlInAs layer 3. The carrier mobility is prevented from lowering.

Figure 4:
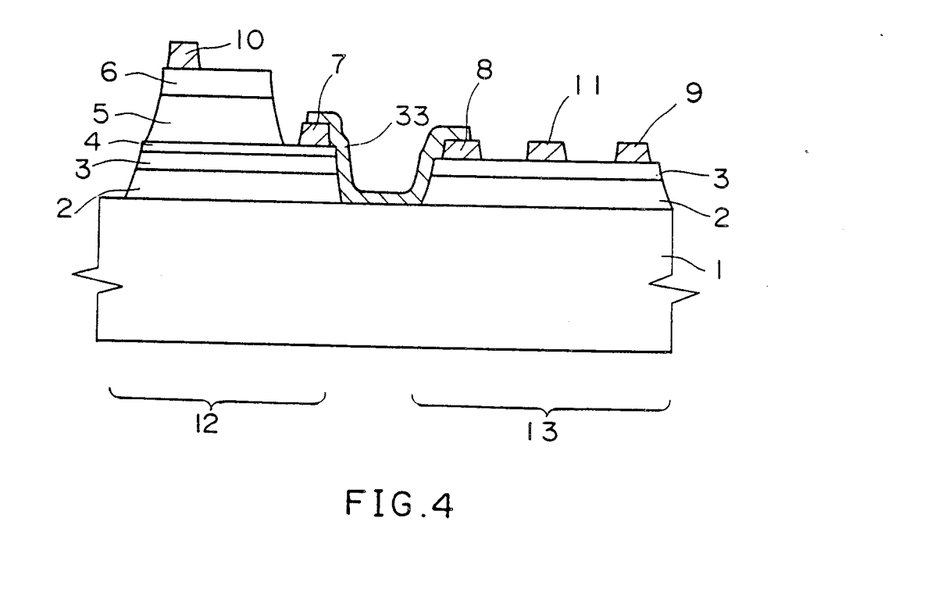
FIG. 4 is a sectional view of the opto-electronic integrated circuit according to additional further another embodiment of this invention, having the source electrode and drain electrode of a HEMT as an electronic device formed directly on a n-AlInAs layer 3 respectively.

FIG. 4 shows additional further another embodiment in which the epitaxial layer 4 of n-InP or n-GaInAs is removed from the HEMT of the above described embodiments. The opto-electronic integrated circuit according to this embodiment can be formed by adding a step of etching the epitaxial layer 4 subsequent to the etching step of FIG. 1C. The opto-electronic integrated circuit according to the embodiment as well may include the buffer layer 34 between the InP substrate 1 and the GaInAs layer 2 and/or the spacer 35 between the GaInAs layer 2 and the n-AlInAs layer 3. The same effects are in the embodiments of FIGS. 2 and 3 are produced.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method for producing an opto-electric integrated circuit having a field effect transistor as an electronic device and a photo-diode as an optical device both formed on an InP substrate, comprising:
   a first step of forming a first epitaxial layer of GaInAs, a second epitaxial layer of n-AlInAs, a third epitaxial layer of n-InP, a fourth epitaxial layer of undoped GaInAs and a fifth epitaxial layer of p-GaInAs formed on an InP substrate in the stated order;
   a second step of partially removing the fifth and the fourth epitaxial layers, leaving a p-electrode region in a photo-diode region so as to expose the third epitaxial layer;
   a third step of forming an anode of said photo-diode on the fifth epitaxial layer and a cathode thereof on the third epitaxial layer in the photo-diode region, and forming a source electrode and a drain electrode of the field effect transistor on the the third epitaxial layer in a field effect transistor region;

a fourth step of removing the third, the second and the first epitaxial layers between the photo-diode and the field effect transistor, so as to electrically separate both regions;

a fifth step of etching the third epitaxial layer between the source electrode and the drain electrode in the field effect transistor region to expose the second epitaxial layer so as to form a gate electrode on the exposed second epitaxial layer; and a sixth step of forming a wiring for electrically connecting the thus formed photo-diode and field effect transistor.

2. A method for producing an opto-electric integrated circuit according to claim 1, wherein the fifth epitaxial layer comprises p-InP in place of p-GaInAs.

3. A method for producing an opto-electric integrated circuit according to claim 1, wherein the third epitaxial layer comprises n-GaInAs in place of n-InP.

4. A method for producing an opto-electric integrated circuit according to claim 2, wherein the third epitaxial layer comprises n-GaInAs in place n-InP.

* * * * *